(12) United States Patent
Park et al.

(10) Patent No.: US 10,732,459 B2
(45) Date of Patent: Aug. 4, 2020

(54) BACKLIGHT UNIT AND LIQUID CRYSTAL DISPLAY DEVICE INCLUDING THE SAME

(71) Applicant: LG Display Co., Ltd., Seoul (KR)

(72) Inventors: Hyun-Min Park, Paju-si (KR); Rok-Hee Lee, Paju-si (KR); Ki-Seong Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/135,838

(22) Filed: Sep. 19, 2018

(65) Prior Publication Data

US 2019/0094619 A1 Mar. 28, 2019

(30) Foreign Application Priority Data

Sep. 28, 2017 (KR) .................. 10-2017-0126436

(51) Int. Cl.
*G02F 1/13357* (2006.01)
*H01L 25/075* (2006.01)
(Continued)

(52) U.S. Cl.
CPC .. *G02F 1/133606* (2013.01); *G02F 1/133603* (2013.01); *G02F 1/133605* (2013.01);
(Continued)

(58) Field of Classification Search
CPC ............................................... G02F 1/133606
See application file for complete search history.

(56) References Cited

U.S. PATENT DOCUMENTS

2011/0315956 A1 12/2011 Tischler et al.
2012/0147277 A1* 6/2012 Yamamoto ........... G02B 6/0021
348/790
(Continued)

FOREIGN PATENT DOCUMENTS

GB            2 448 564 A   10/2008
KR   10-2006-0036294 A       4/2006
KR   10-2007-0084912 A       8/2007

OTHER PUBLICATIONS

Tsai et al., "LED Backlight Module by a Lightguide-Diffusive Component With Tetrahedron Reflector Array", Journal of Display Technology, vol. 8, No. 6, Jun. 2012, pp. 321-328.

*Primary Examiner* — Edmond C Lau
(74) *Attorney, Agent, or Firm* — Birch, Stewart, Kolasch & Birch, LLP

(57) ABSTRACT

A backlight unit includes a plurality of light emitting diode (LED) packages on a top surface of a circuit board, an encapsulation member located on the circuit board and covering the plurality of LED packages, and an integrated pattern sheet on the encapsulation member. The integrated pattern sheet includes a base layer, a plurality of reflective patterns at a bottom surface of the base layer and respectively corresponding to the plurality of LED packages, and a plurality of diffusion patterns at a top surface of the base layer, wherein the reflective patterns are configured with a relational expression of $c+(t2-t1)*\tan\{(\sin^{-1}(1/n)\} > d < 1.8p$, where c, t1 and p are a width, a height and a pitch of the LED package, respectively, t2 and n are a height and a refractive index of the encapsulation member, respectively, and d is a width of the reflective pattern.

18 Claims, 11 Drawing Sheets

(51) Int. Cl.
| | |
|---|---|
| *H01L 25/13* | (2006.01) |
| *H05K 1/02* | (2006.01) |
| *H05K 1/18* | (2006.01) |
| *H01L 33/50* | (2010.01) |
| *H01L 33/52* | (2010.01) |
| *H01L 33/60* | (2010.01) |

(52) U.S. Cl.
CPC .......... *H01L 25/0753* (2013.01); *H01L 25/13* (2013.01); *H05K 1/0274* (2013.01); *H05K 1/181* (2013.01); *G02F 2001/133614* (2013.01); *H01L 33/507* (2013.01); *H01L 33/52* (2013.01); *H01L 33/60* (2013.01); *H05K 2201/10106* (2013.01); *H05K 2201/10522* (2013.01); *H05K 2201/2054* (2013.01)

(56) References Cited

U.S. PATENT DOCUMENTS

2013/0181238 A1\* 7/2013 Tischler .............. H01L 23/4985
 257/88
2018/0182940 A1\* 6/2018 Yamamoto ............ F21V 7/0083

\* cited by examiner

292

292

BACKLIGHT UNIT AND LIQUID CRYSTAL DISPLAY DEVICE INCLUDING THE SAME

CROSS REFERENCE TO RELATED APPLICATIONS

The present application claims the priority benefit of Korean Patent Application No. 10-2017-0126436 filed in Republic of Korea on Sep. 28, 2017, which is hereby incorporated by reference in its entirety for all purposes as if fully set forth herein.

BACKGROUND OF THE INVENTION

Field of the Invention

The present invention relates to a backlight unit and a liquid crystal display device including the same.

Discussion of the Related Art

Facing information society, needs for display devices have increased variously. Recently, flat display devices, such as a liquid crystal display (LCD) device, a plasma display panel (PDP) device, and an organic light emitting diode (OLED) display device, are used.

Among these display devices, LCD devices are widely used because of advantages in a lightweight, a thin profile, a low power consumption and the like. The LCD device includes a liquid crystal panel, and a backlight unit below the liquid crystal panel.

The backlight unit can be categorized into a side edge type backlight unit and a direct type backlight unit.

The side edge type backlight unit is configured such that light sources are located at a side of a light guide plate below the liquid crystal panel and a side light from the light sources is converted into a plane light by the light guide plate. However, since the light sources are located at a side of the backlight unit, it is difficult to realize a local dimming of individually driving a plurality of regions into which a backlight unit is divided.

The direct type backlight unit is configured such that a plurality of light sources are arranged directly below the liquid crystal panel and thus supply a light to the liquid crystal panel. The direct type backlight unit improves uniformity and brightness of a light supplied to the liquid crystal panel and realizes a local dimming, and thus reduces a power consumption.

However, since the light sources of the direct type backlight unit supply a light to the liquid crystal panel directly over them, a mura such as a hot spot happens over the light sources and thus a display quality can be reduced.

SUMMARY OF THE INVENTION

Accordingly, the present invention is directed to an LCD device that substantially obviates one or more of the problems due to limitations and disadvantages of the related art.

An object of the present invention is to provide a backlight unit and an LCD device including the same that can prevent a mura such as a hot spot thus improve a display quality.

Additional features and advantages of the invention will be set forth in the description which follows, and in part will be apparent from the description, or can be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described herein, a backlight unit includes a plurality of light emitting diode (LED) packages on a top surface of a circuit board, an encapsulation member located on the circuit board and covering the plurality of LED packages, and an integrated pattern sheet on the encapsulation member, wherein the integrated pattern sheet includes a base layer, a plurality of reflective patterns at a bottom surface of the base layer and respectively corresponding to the plurality of LED packages, and a plurality of diffusion patterns at a top surface of the base layer, wherein the reflective patterns are configured with a relational expression of $c+(t2-t1)*\tan\{(\sin^{-1}(1/n)\} < d < 1.8p$, where c, t1 and p are a width, a height and a pitch of the LED package, respectively, t2 and n are a height and a refractive index of the encapsulation member, respectively, and d is a width of the reflective pattern.

In another aspect, a liquid crystal display (LCD) device includes a liquid crystal panel and a backlight unit below the liquid crystal panel, wherein the backlight unit includes a plurality of light emitting diode (LED) packages on a top surface of a circuit board, an encapsulation member located on the circuit board and covering the plurality of LED packages, and an integrated pattern sheet on the encapsulation member, wherein the integrated pattern sheet includes a base layer, a plurality of reflective patterns at a bottom surface of the base layer and respectively corresponding to the plurality of LED packages, and a plurality of diffusion patterns at a top surface of the base layer, wherein the reflective patterns are configured with a relational expression of $c+(t2-t1)*\tan\{(\sin^{-1}(1/n)\} < d < 1.8p$, where c, t1 and p are a width, a height and a pitch of the LED package, respectively, t2 and n are a height and a refractive index of the encapsulation member, respectively, and d is a width of the reflective pattern.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Reference will now be made in detail to embodiments, examples of which are illustrated in the accompanying drawings. The same reference numbers can be used throughout the drawings to refer to the same or like parts.

First Embodiment

Figure 1:
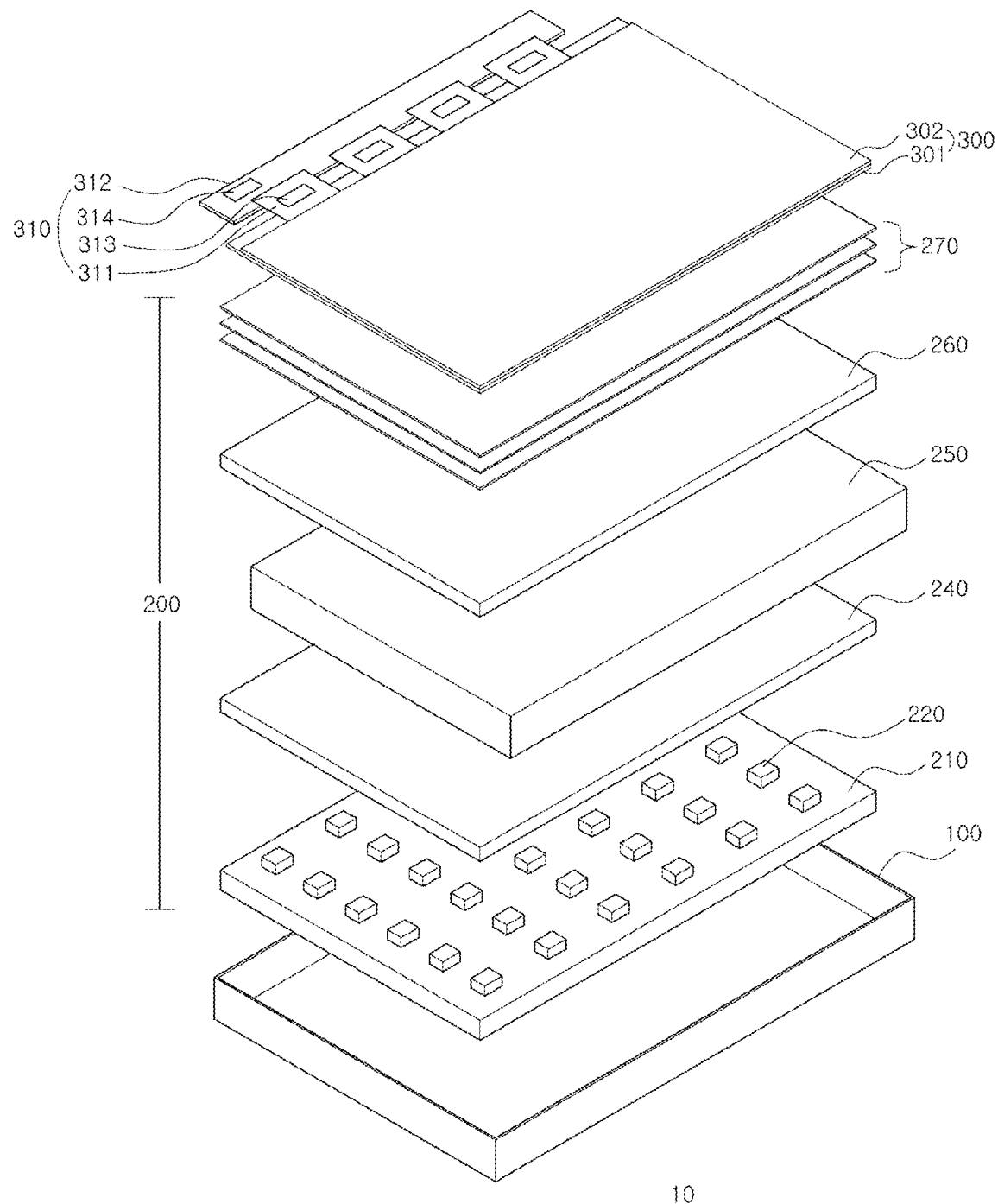
FIGS. 1 and 2 are an exploded perspective view and a cross-sectional view, respectively, schematically illustrating a backlight unit and an LCD device including the same according to a first embodiment of the present invention.
Figure 2:
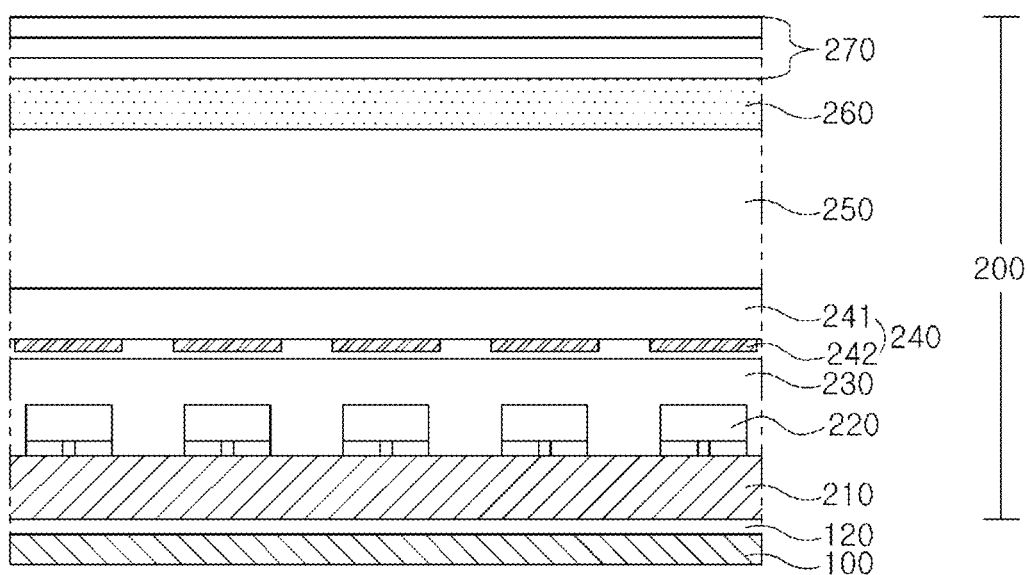

FIGS. 1 and 2 are an exploded perspective view and a cross-sectional view, respectively, schematically illustrating a backlight unit and an LCD device including the same according to a first embodiment of the present invention. All the components of the backlight unit and the LCD device including the backlight unit according to all embodiments of the present invention are operatively coupled and configured.

Referring to FIGS. 1 and 2, an LCD device 10 of this embodiment includes a backlight unit 200, a liquid crystal panel 300, a panel driving circuit 310, a bottom cover 100.

The bottom cover 100 is located below, and support, the backlight unit 200. The bottom cover 100 can serve as a component included in the backlight unit 200.

The bottom cover 100 can be formed in a box shape as its top being open to receive the backlight unit 200 inside it. However, the bottom cover 100 can be formed in other configurations, for example, in a plate shape.

The LCD device 10 can include a guide panel that surrounds and supports a side of the backlight unit 200 and the liquid crystal panel 300, and a top cover that covers edges of a top surface of the liquid crystal panel 300.

The backlight unit 200 is a direct type backlight unit, in which a plurality of light sources, for example, light emitting diodes (LEDs) spaced part from each other are arranged below, and face, the liquid crystal panel 300.

The backlight unit 200 can include a circuit board 210, a plurality of LED packages 220, an encapsulation member (or encapsulation mold) 230, a reflective pattern sheet 240, a diffusion plate 250, a fluorescent sheet 260 and an optical sheet 270.

The circuit board 210 is located on a top surface of the bottom cover 100. The circuit board 210 can be attached to the bottom cover 100 through an adhesive 120 such as a double-sided adhesive tape.

The plurality of LED packages 220 are mounted on a top surface of the circuit board 210. The top surface of the circuit board 210 can have a reflection property, for example, a reflection film can be formed at the top surface of the circuit board 210. In this case, a light is reflected by the circuit board 210 and then travels toward the liquid crystal panel 300.

The LED package 220 emits a light by a driving signal supplied from a backlight driving portion.

The LED package 220 can have various structures. For example, the LED package 220 can have a lateral chip structure, flip chip structure, vertical chip structure, chip scale package (CSP) structure, or the like.

Among the structures, the CSP structure is configured to include an LED chip and a mold enclosing the LED chip, and in this case, a size of the LED package 220 can be minimized and a thickness of the backlight unit 200 can be reduced accordingly.

An encapsulation member 230 can be located on, and entirely cover, a top surface of the circuit board 210 having the LED packages 220 mounted. The encapsulation member 230 can be coated at a thickness that is greater than that of the LED package 220 to cover all LED packages 220 mounted on the circuit board 210. The encapsulation member 230 can serve to stably fix the LED package 220 onto the circuit board 210 and protect the LED package 220 from the outside.

The encapsulation member 230 can be made of a resin based material including, for example, one or combination of Si, UV resin, PC and PMMA.

The diffusion plate 250 is located on the encapsulation member 230. The diffusion plate 250 serves to diffuse a light from the LED packages 220 and supply a uniform plane light to the liquid crystal panel 300.

The reflective pattern sheet 240 can be located below the diffusion plate 250 i.e., located on a bottom surface of the diffusion plate 250. The reflective pattern sheet 240 can include a base layer 241, and a plurality of reflective patterns 242 that are formed on a bottom surface of the base layer 241 and are arranged to correspond to the plurality of LED packages 220, respectively.

The reflective pattern 242 serves to reflect and distribute in a side direction, a part of a light upwardly emitted from the LED package 220 therebelow, and to transmit a remaining part of the light upwardly emitted from the LED package 220. Accordingly, most of the light traveling in an upwardly vertical direction then being incident on the liquid crystal panel 300 can be prevented. Thus, an occurrence of a hot spot caused by a light incidence in a upwardly vertical direction can be prevented, and a reduction of a display quality can be prevented.

The fluorescent sheet 260 can be located on the diffusion plate 250. The fluorescent sheet 260 can include at least one fluorescent substance that absorbs a part of a light of first color produced by the LED package 220 and makes at least one color that is different from the first color.

In case of using the fluorescent sheet 260, a light of the first color produced by the LED package 220 and a light of the color produced by the fluorescent sheet 260 are mixed to finally form a white light, and the white light is supplied to the liquid crystal panel 300.

For example, when the LED package 220 produces a blue light as the first color light, the fluorescent sheet 260 can absorb a part of the blue light and produce a yellow light as a second color light.

Alternatively, when the LED package 220 produces a white light, the fluorescent sheet 260 can be eliminated.

At least one optical sheet 270 can be located on the fluorescent sheet 260. In this embodiment, three optical sheets 270 are shown by way of example.

The liquid crystal panel 300 is located on the backlight unit 200. The liquid crystal panel 300 adjusts a transmissivity of a liquid crystal layer therein to display images. The liquid crystal panel 300 can include a first substrate (or a lower substrate) 301, and a second substrate (or an upper substrate) 302 facing the first substrate 301, and a liquid crystal layer between the first and second substrates 301 and 302.

A first polarization plate and a second polarization plate can be attached to an outer surface of the first substrate 301 and an outer surface of the second substrate 302, respectively.

In the liquid crystal panel 300, a liquid crystal layer of each pixel is operated by an electric field produced by a data voltage and a common voltage applied to each pixel, and according to a transmissivity of the liquid crystal layer, a color image can be displayed.

The panel driving portion 310 can be connected to a pad portion of the first substrate 301 and operate each pixel of the liquid crystal panel 300. For example, the panel driving portion 310 can include a plurality of circuit films 311 connected to the pad portion of the liquid crystal panel 300, a data IC 313 mounted on each circuit film 311, a display printed circuit board 312 connected to the circuit films 311, and a timing control circuit 314 mounted on the display printed circuit board 312.

The timing control circuit 314 can sort and process digital image data input from an external driving system to produce pixel data for respective pixels of the liquid crystal panel 300, in response to timing signals supplied from the external driving system, and supply the pixel data to the data IC 313. Further, the timing control circuit 314 can produce a data control signal and a gate control signal based on the timing signals, and supply the data control signal and the gate control signal to the data IC and a gate IC, respectively.

Further, the timing control circuit 314 can control an emission operation of the backlight unit 200 according to a local dimming method, and individually control a brightness of the liquid crystal panel 300 by region.

In this embodiment, since the backlight unit 200 is a direct type backlight unit, a local dimming to operate the liquid crystal panel by region can be realized, and thus a contrast ratio can be improved and a power consumption can be reduced.

Further, since the reflective pattern sheet 240 including the reflective patterns 242 that are located corresponding to the respective LED packages 220 is used, a light output in a vertical direction is reduced, thus a hot spot can be prevented, and thus a display quality can be improved.

Since a light is reflected by the reflective pattern sheet 240 and traveling to a side direction, an optical gap of the direct type backlight unit 200 can be reduced. Thus, a thickness of the backlight unit 200 can be reduced, and the LCD device 10 in a thin profile can be achieved. Further, because of the reduction of the optical gap, a halo defect that a light in a local dimming region undesirably enters into a neighboring local dimming region can be prevented.

Second Embodiment

Figure 3:
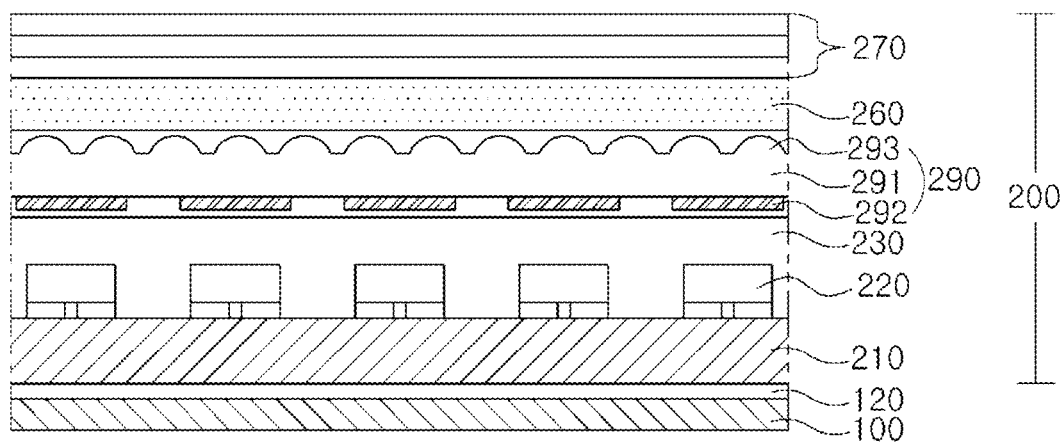
FIG. 3 is a cross-sectional view schematically illustrating a backlight unit and an LCD device including the same according to a second embodiment of the present invention.

FIG. 3 is a cross-sectional view schematically illustrating a backlight unit and an LCD device including the same according to a second embodiment of the present invention.

Explanations of the same or like parts of the first embodiment may be omitted or may be brief.

Referring to FIG. 3, the backlight unit 200 can include an integrated pattern sheet 290 as a function-integrated single sheet that has (or integrates) functions of the reflective pattern sheet 240 and the diffusion plate 250 of the first embodiment.

The integrated pattern sheet 290 can include a base layer (or base substrate) 291, a plurality of reflective patterns 292 formed at one surface e.g., a bottom surface of the base layer 291, and a plurality of diffusion patterns 293 formed at the other surface e.g., a top surface of the base layer 291.

Figure 4:
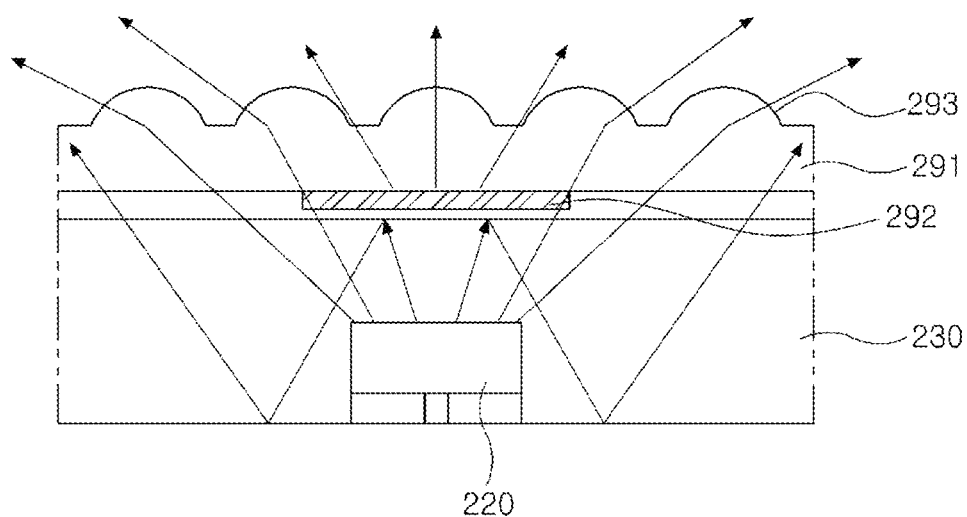
FIG. 4 is a view schematically illustrating a light traveling path through an integrated pattern sheet according to the second embodiment of the present invention.

Referring further to FIG. 4 illustrating a light traveling path through the integrated pattern sheet 290 of this embodiment, like the reflective pattern 242 of the first embodiment, the reflective pattern 292 serves to reflect, and distribute in a side direction, a part of a light upwardly emitted from the LED package 220 therebelow, and to transmits a remaining part of the light upwardly emitted from the LED package 220.

Like the diffusion plate 250 of the first embodiment, the diffusion pattern 293 serves to diffuse a light incident thereon.

As such, by the integrated pattern sheet 290 including both of the reflective pattern 292 and the diffusion pattern 293, all of the functions of the reflective pattern sheet 240 and the diffusion plate 250 of the first embodiment can be conducted, along with producing, and supplying to the liquid crystal panel 300, an uniform plane light.

Thus, a thickness of the backlight unit 200 using the integrated pattern sheet 290 can be greatly reduced, compared with the backlight unit of the first embodiment.

The integrated pattern sheet 290 and the backlight unit including it are explained in more detail.

The base layer 291 of the integrated pattern sheet 290 can be formed in a substantially flat plate type. The base layer 291 can be made of, for example, PMMA (poly(methyl methacrylate)), PC (polycarbonate), PS (polystyrene), Si, COC (cyclic olefin copolymer), MS(methyl methacrylate styrene), UV resin, glass or the like.

The reflective patterns 292 are arranged to be spaced apart from each other and correspond to the respective LED packages 220 on the circuit board 210.

The reflective pattern 292 can be formed on the bottom surface of the base layer 291 using, for example, a printing method. The reflective pattern 292 can be made of a reflective material, for example, a metal, $TiO_2$, dichroic dye or the like.

The reflective pattern 292 can include a transmissive region therein such that the reflective pattern 292 transmits a part of a light incident thereon and a remaining part of the light. Further, the reflective pattern 292 can have a circular shape or polygonal shape such as a rectangular shape, in a plane view.

Figure 5A:
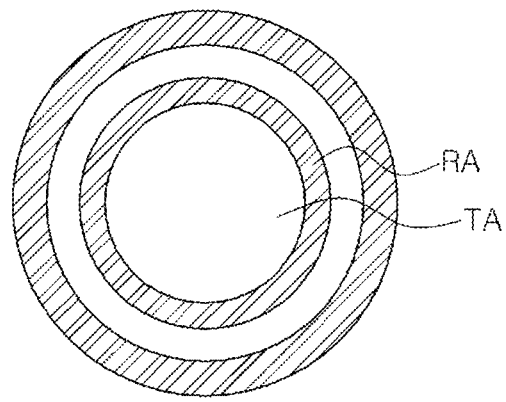
FIG. 5A is a plan view illustrating a circular-shaped reflective pattern including a transmissive region therein according to the second embodiment of the present invention.
Figure 5B:
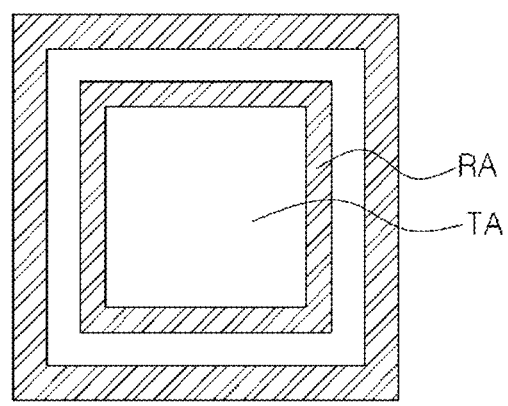
FIG. 5B is a plan view illustrating a rectangular-shaped reflective pattern including a transmissive region therein according to the second embodiment of the present invention.

In this regard, FIGS. 5A and 5B respectively show a circular-shaped reflective pattern and a rectangular-shaped reflective pattern each including a transmissive region therein according to the second embodiment of the present invention.

Referring to FIGS. 5A and 5B, the circular-shaped or rectangular-shaped reflective pattern 292 can be configured such that a transmissive region TA and a reflective region RA are arranged alternately at least once in an outer side direction from a center of the reflective pattern 292. Since the reflective pattern 292 is configured with the transmissive region TA and the reflective region RA, a part of a light incident on the reflective pattern 292 can be reflected and the other part of the light can be transmitted, and particularly, a substantially uniform light distribution in all directions on a plane can be achieved.

The diffusion patterns 293 on the top surface of the base layer 291 can be spaced apart from each other or contact neighboring ones. In this embodiment, an arrangement of the diffusion patterns 293 being spaced apart from each other is shown by way of example.

Figure 6:
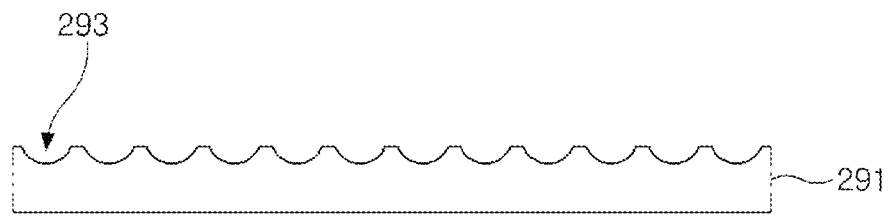
FIG. 6 is a cross-sectional view schematically illustrating an depressed diffusion pattern according to the second embodiment of the present invention.

The diffusion pattern 293 is a lens pattern to perform a light diffusion, and can be formed in an embossed form or depressed form. FIGS. 3 and 4 show an example of an embossed diffusion pattern 293, and FIG. 6 shows an example of an depressed diffusion pattern 293. Since the depressed diffusion pattern 293 is dented inside the base layer 291, this case can have an advantage of reducing a thickness of the integrated pattern sheet 290 compared with a case using the embossed diffusion pattern protruded outwardly from the base layer 291.

Figure 7A:
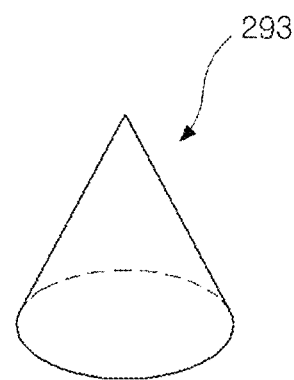
FIG. 7A is a cross-sectional view schematically illustrating a diffusion pattern in a cone shape according to the second embodiment of the present invention.
Figure 7B:
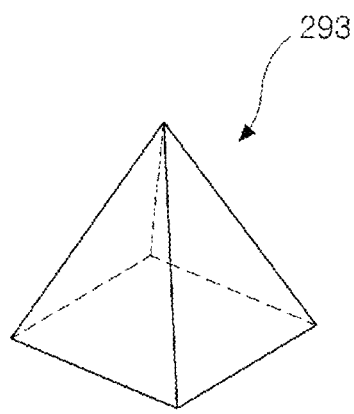
FIG. 7B is a cross-sectional view schematically illustrating a diffusion pattern in a quadrangular pyramid shape according to the second embodiment of the present invention.
Figure 7C:
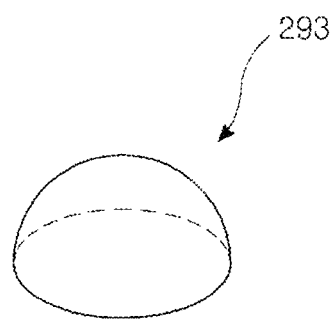
FIG. 7C is a cross-sectional view schematically illustrating a diffusion pattern in a hemisphere shape according to the second embodiment of the present invention.
Figure 7D:
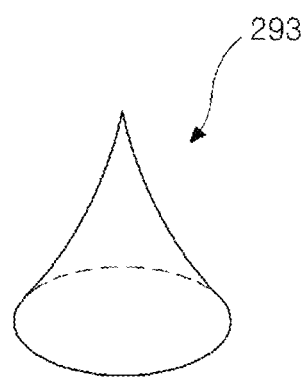
FIG. 7D is a cross-sectional view schematically illustrating a diffusion pattern in a cone shape having a side surface in an inwardly-dented arc form according to the second embodiment of the present invention.

The diffusion pattern 293 can have various shapes, which refer to FIGS. 7A to 7D. FIG. 7A shows an example of a diffusion pattern in a cone shape according to the second embodiment of the present invention, FIG. 7B shows an example of a diffusion pattern in a quadrangular pyramid shape according to the second embodiment of the present invention, FIG. 7C shows an example of a diffusion pattern in a hemisphere shape according to the second embodiment of the present invention, and FIG. 7D shows an example of a diffusion pattern in a cone shape, which has a side surface in an inwardly-dented arc form, according to the second embodiment of the present invention. Other shapes different from those of FIGS. 7A to 7D are applicable to the diffusion pattern 293.

Figure 8:
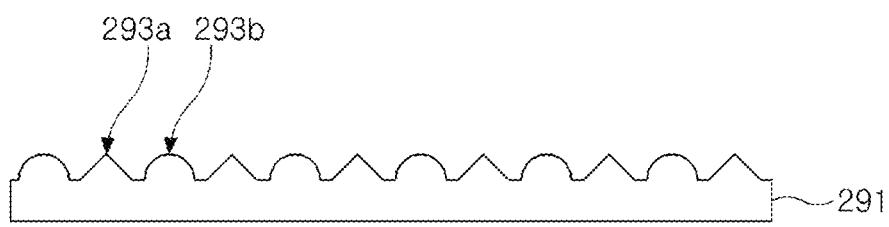
FIG. 8 is a cross-sectional view schematically illustrating different shaped diffusion patterns mixed and arranged according to the second embodiment of the present invention.

Further, the diffusion patterns 293 having different shapes can be mixed and arranged on the top surface of the base layer 291. For example, referring to FIG. 8, a first diffusion pattern 293a of a cone shape or quadrangular pyramid shape and a second diffusion pattern 293b of a hemisphere shape can be mixed and arranged, and in this case, the first and second patterns 293a and 293b can alternate along a direction. Other variations are possible.

When the different shaped diffusion patterns 293 are arranged, the different shaped diffusion patterns 293 can complement each other in diffusion function, and a further uniform light distribution can be achieved.

Figure 9:
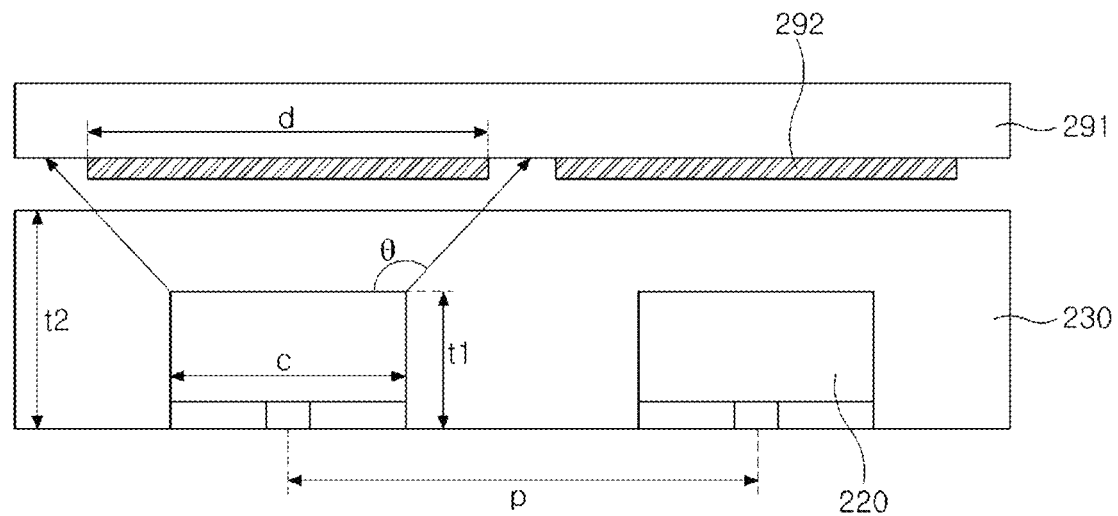
FIG. 9 is a cross-sectional view illustrating a relation of a reflective pattern, an encapsulation member and an LED package according to the second embodiment of the present invention.

The backlight unit 200 using the integrated pattern sheet 290 of this embodiment can have substantially the same optical property as the backlight unit using the reflective pattern sheet 240 and the diffusion plate 250 of the first embodiment. To do this, it is preferable that the reflective patterns 292 are configured as the following relational expression. This is explained with reference to FIG. 9.

Relational expression:

$$c+(t2-t1)*\tan(\theta) < d < 1.8p => c+(t2-t1)*\tan\{(\sin^{-1}(1/n))\} < d < 1.8p.$$

In the above expression, 'c' is a width of the light source i.e., the LED package 220, 't1' is a height (or thickness) of the LED package 220, 't2' is a height (or thickness) of the encapsulation member 230, 'n' is a refractive index of the encapsulation member 230, 'd' is a width of the reflective pattern 292, 'p' is a pitch of the LED package 220, and '$\theta$' is a view angle of the LED package 220.

When the reflective patterns 292 are formed according to the above relational expression, an optical property substantially equal to that of the first embodiment can be obtained, and thus a uniform light distribution can be obtained and a hot spot can be prevented.

This is explained with reference to FIGS. 10 and 11, which respectively shows simulation results of this embodiment and a comparative example. The simulation of FIGS. 10 and 11 are conducted with a case that LED packages are arranged in a 3*3 matrix, each LED package has a size of 700 um*700 um*150 um, and a pitch p of the LED package is 3 mm.

Figure 10:
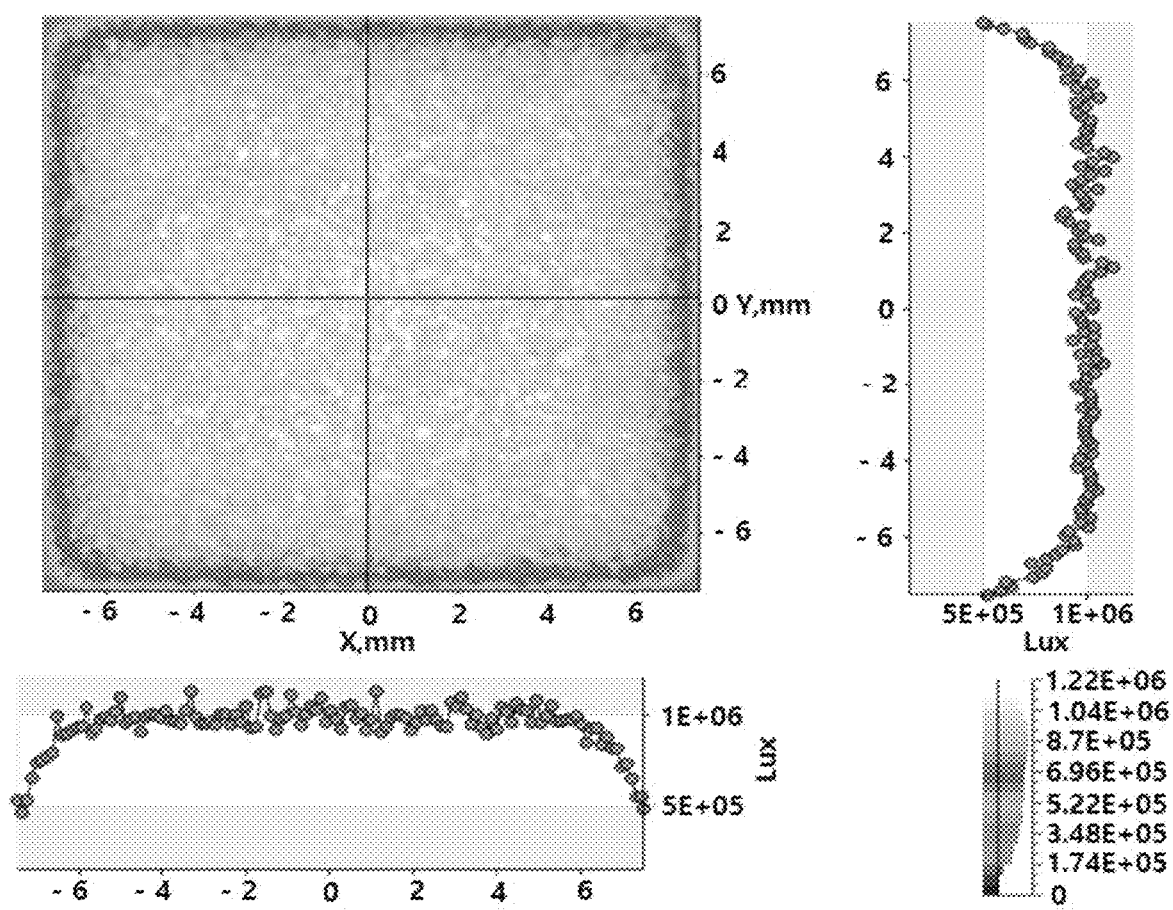
FIGS. 10 and 11 are views respectively illustrating simulation results of light distributions according to the second embodiment of the present invention and a comparative example.

As shown in FIG. 10, in this embodiment of the present invention, the width d of the reflective pattern 292 is 4.8 mm as satisfying the relational expression. Accordingly, a light is uniformly distributed overall, thus a grade of an image is assessed as '1', and thus a hot spot is not observed. In this case, a light flux over the LED package is about 1831 m.

Figure 11:
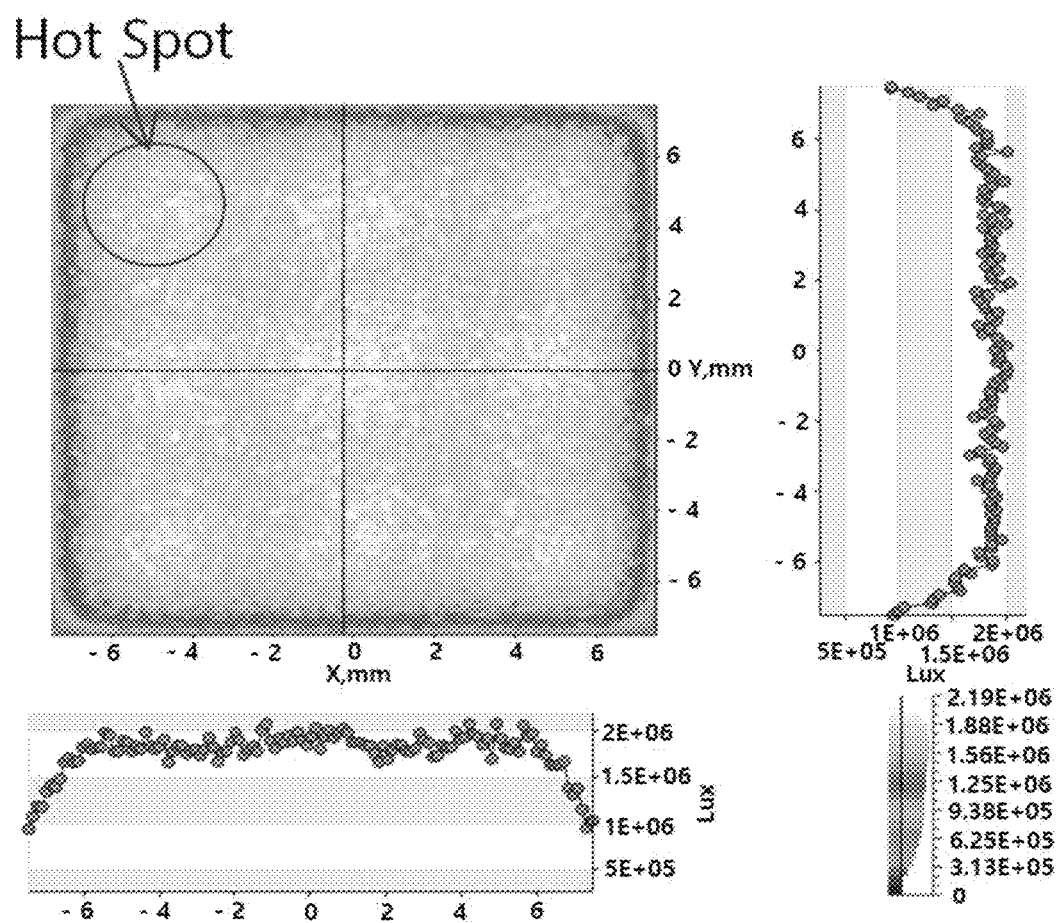

To the contrary, as shown in FIG. 11, in the comparative example, a width d of its reflective pattern is 0.5 mm as not satisfying the relational expression. Accordingly, a light is not uniformly distributed overall, thus a grade of an image is assessed as '3', and thus a hot spot is observed over the LED package. In this case, a light flux over the LED package is about 3391 m that is high as 185% of the light flux of this embodiment.

As such, in this embodiment of the present invention, by designing the reflective patterns 292 according to the relational expression, a thickness of the backlight unit 200 using the integrated pattern sheet 290 can be reduced, and further, a uniform light distribution without a hot spot can be achieved thus a display quality can be improved. Therefore, an ultra thin LCD device displaying a high quality image can be effectively realized.

Figure 12:
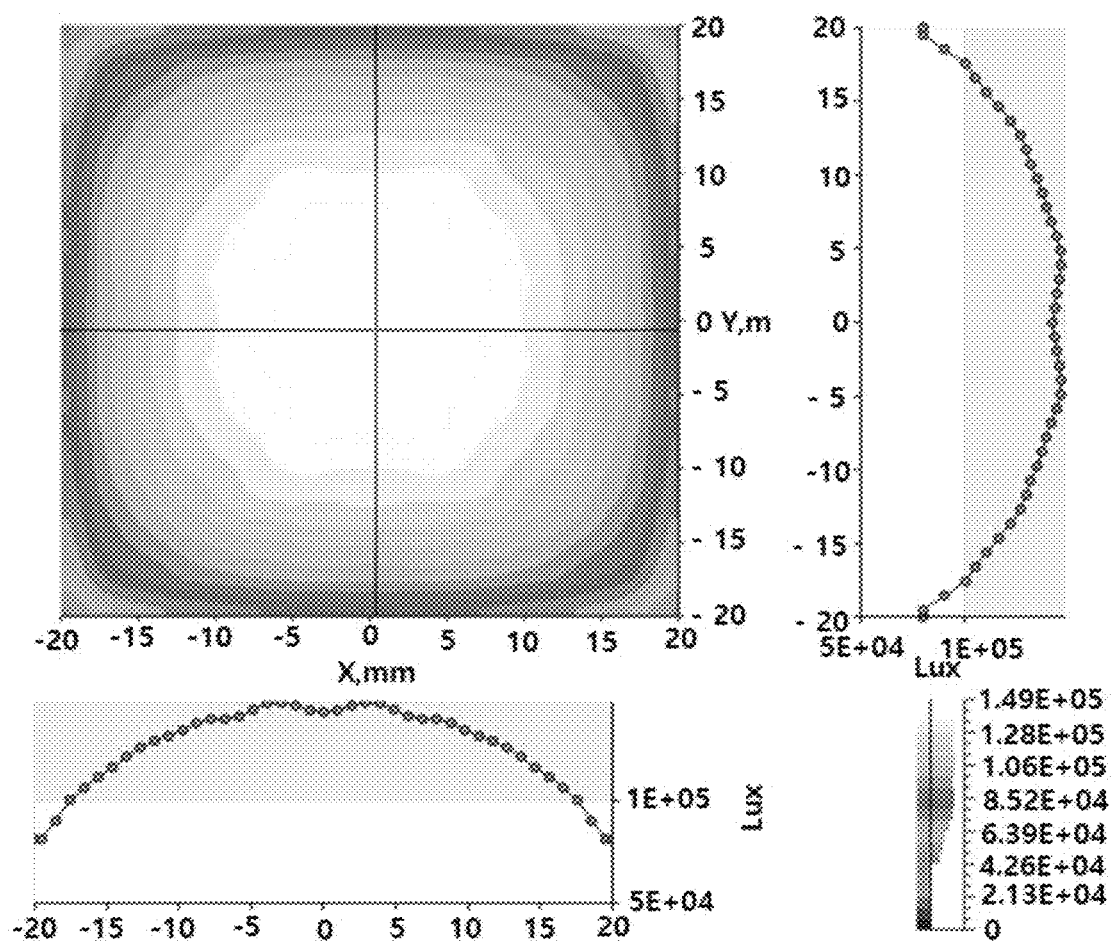
FIGS. 12 and 13 are views respectively illustrating simulation results of light distributions according to the first and second embodiments of the present invention.
Figure 13:
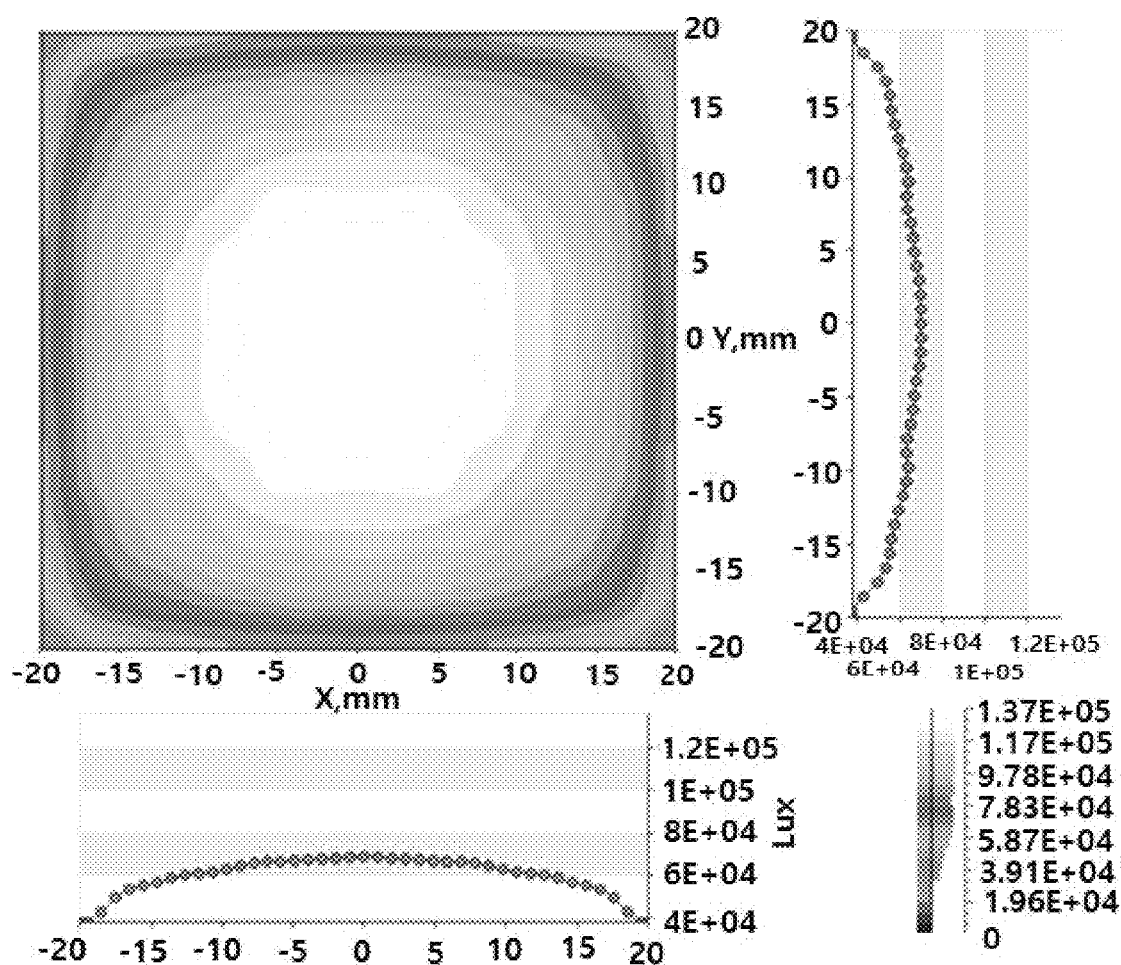

This reduction of the thickness of the LCD device is explained with reference to FIGS. 12 and 13 and Tables 1 and 2. FIGS. 12 and 13 respectively show light distributions of the LCD devices according to the first and second embodiments of the present invention. Tables 1 and 2 respectively show examples of thicknesses of the LCD devices according to the first and second embodiments of the present invention. Particularly, in Tables 1 and 2, the thicknesses, except for thicknesses of the liquid crystal panels, of the LCD devices of the first and second embodiments are written.

TABLE 1

| Components | Thickness[mm] |
|---|---|
| Optical sheets (270)(3 sheets) | 0.4 |
|  | 0.155 |
|  | 0.12 |
| Fluorescent sheet (260) | 0.13 |
| Diffusion plate (250) | 1.5 |

TABLE 1-continued

| Components | Thickness[mm] |
|---|---|
| Reflective pattern sheet (240) | 0.15 |
| Encapsulation member (230) | 0.5 |
| LED package (220) | — |
| Circuit board (210) | 0.37 |
| Adhesive (120) | 0.1 |
| Bottom cover (100) | 0.4 |
| Total | 3.83 (100%) |

TABLE 2

| Components | | Thickness[mm] |
|---|---|---|
| Optical sheets (270)(3 sheets) | | 0.4 |
| | | 0.155 |
| | | 0.12 |
| Fluorescent sheet (260) | | 0.13 |
| Integrated pattern sheet (290) | Diffusion pattern (293) | 0.08 |
| | Base layer (291) | 0.15 |
| | Reflective pattern (292) | 0.02 |
| Encapsulation member (230) | | 0.5 |
| LED package (220) | | — |
| Circuit board (210) | | 0.37 |
| Adhesive (120) | | 0.1 |
| Bottom cover (100) | | 0.4 |
| Total | | 2.42 (60%) |

As shown in FIGS. 12 and 13, a light distribution of the second embodiment is substantially equal to a light distribution of the first embodiment. Accordingly, the LCD device of the second embodiment can display an image with the same optical property as that of the LCD device of the first embodiment.

Referring to Table 1, in the first embodiment, the reflective pattern sheet 240 has a thickness of 0.15 mm, the diffusion plate 250 has a thickness of 1.5 mm, and the LCD device has a thickness of 3.83 mm, except for a thickness of a liquid crystal panel.

Referring to Table 2, in the second embodiment, the integrated pattern sheet 290 has a thickness of 0.25 mm. In other words, the diffusion pattern 293 has a thickness of 0.08 mm, the base layer 291 has a thickness of 0.15 mm, and the reflective pattern 292 has a thickness of 0.02 mm. The LCD device including this component has a thickness of 2.42 mm, except for a thickness of a liquid crystal panel.

As such, in the second embodiment, the integrated pattern sheet 290 has the thickness, 0.25 mm, as being reduced remarkably compared with the thickness, 1.65 mm (i.e., 0.15 mm+1.5 mm), of the reflective pattern sheet 240 and the diffusion plate 250 of the first embodiment which correspond to the integrated pattern sheet 290. Accordingly, a total thickness, 2.42 mm, of the second embodiment is about 60% of a total thickness, 3.83 mm, of the first embodiment, and the backlight unit and the LCD device of the second embodiment can be reduced greatly.

As such, according to the second embodiment, ultra thin backlight unit and LCD device with substantially the same optical property as the first embodiment can be realized.

As described above, according to the embodiments of the present invention, the reflective pattern is located on the LED package, and a diffusing member such as the diffusion plate or diffusion pattern is located on the LED package. Accordingly, an output of a light traveling upwardly over the LED package can be reduced and an optical gap can be reduced. Thus, a mura such as a hot spot can be prevented thus a display quality can be improved, and the backlight unit and the LCD device in thin profile can be realized.

Further, when the single integrated pattern sheet including the reflective pattern and the diffusion pattern is used, an optical property can be maintained and a thickness can be reduced greatly. Thus, ultra thin backlight unit and LCD device with a high display quality can be realized.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A backlight unit comprising:
a plurality of light emitting diode (LED) packages on a top surface of a circuit board;
an encapsulation member located on the circuit board and covering the plurality of LED packages; and
an integrated pattern sheet on the encapsulation member, the integrated pattern sheet including:
a base layer;
a plurality of reflective patterns formed on a bottom surface of the base layer and respectively corresponding to the plurality of LED packages, each of the plurality of reflective patterns serving to reflect and distribute in a side direction, a part of a light upwardly emitted from the corresponding one of the plurality of LED packages therebelow and to transmit a remaining part of the light upwardly emitted from the corresponding one of the plurality of LED packages therebelow; and
a plurality of diffusion patterns at a top surface of the base layer,
wherein the reflective patterns are configured with a relational expression:

$$c+(t2-t1)*\tan\{(\sin^{-1}(1/n)\}<d<1.8p,$$

where c, t1 and p are a width, a height and a pitch of the LED package, respectively, t2 and n are a height and a refractive index of the encapsulation member, respectively, and d is a width of the reflective pattern,
wherein each of the plurality of reflective patterns includes a transmissive region at a center of the corresponding reflective pattern and a reflective region surrounding the transmissive region.

2. The backlight unit of claim 1, wherein at least one of the reflective patterns has a circular or polygonal shape.

3. The backlight unit of claim 1, wherein the plurality of diffusion patterns include a diffusion pattern having a cone shape, quadrangular pyramid shape or hemisphere shape.

4. The backlight unit of claim 3, wherein the plurality of diffusion patterns include diffusion patterns having different shapes.

5. The backlight unit of claim 1, wherein at least one of the diffusion patterns is in an embossed form or depressed form.

6. The backlight unit of claim 1, further comprising a fluorescent sheet on the integrated pattern sheet.

7. The backlight unit of claim 1, wherein the plurality of reflective patterns are separated from the encapsulation member.

8. The backlight unit of claim 1, wherein the plurality of reflective patterns are spaced apart from each other with no base layer filling spaces between the plurality of reflective patterns.

9. The backlight unit of claim 1, wherein each of the plurality of reflective patterns further includes another transmissive region surrounding the reflective region and another reflective region surrounding the another transmissive region.

10. A liquid crystal display (LCD) device comprising:
a liquid crystal panel; and
a backlight unit below the liquid crystal panel,
the backlight unit including:
- a plurality of light emitting diode (LED) packages on a top surface of a circuit board;
- an encapsulation member located on the circuit board and covering the plurality of LED packages; and
- an integrated pattern sheet on the encapsulation member,
the integrated pattern sheet including:
  - a base layer;
  - a plurality of reflective patterns formed on a bottom surface of the base layer and respectively corresponding to the plurality of LED packages, each of the plurality of reflective patterns serving to reflect and distribute in a side direction, a part of a light upwardly emitted from the corresponding one of the plurality of LED packages therebelow and to transmit a remaining part of the light upwardly emitted from the corresponding one of the plurality of LED packages therebelow; and
  - a plurality of diffusion patterns at a top surface of the base layer, wherein the reflective patterns are configured with a relational expression:

$$c+(t2-t1)*\tan\{(\sin^{-1}(1/n)\} < d < 1.8p,$$

where c, t1 and p are a width, a height and a pitch of the LED package, respectively, t2 and n are a height and a refractive index of the encapsulation member, respectively, and d is a width of the reflective pattern, wherein each of the plurality of reflective patterns includes a transmissive region at a center of the corresponding reflective pattern and a reflective region surrounding the transmissive region.

11. The LCD device of claim 10, wherein at least one of the reflective patterns has a circular or polygonal shape.

12. The LCD device of claim 10, wherein the plurality of diffusion patterns include a diffusion pattern having a cone shape, quadrangular pyramid shape or hemisphere shape.

13. The LCD device of claim 12, wherein the plurality of diffusion patterns include diffusion patterns having different shapes.

14. The LCD device of claim 10, wherein at least one of the diffusion patterns is in an embossed form or depressed form.

15. The LCD device of claim 10, wherein the backlight unit further includes a fluorescent sheet on the integrated pattern sheet.

16. The LCD device of claim 10, wherein the plurality of reflective patterns are separated from the encapsulation member.

17. The LCD device of claim 10, wherein the plurality of reflective patterns are spaced apart from each other with no base layer filling spaces between the plurality of reflective patterns.

18. The LCD device of claim 10, wherein each of the plurality of reflective patterns further includes another transmissive region surrounding the reflective region and another reflective region surrounding the another transmissive region.

* * * * *